United States Patent
Chen

[11] Patent Number: 6,077,743
[45] Date of Patent: Jun. 20, 2000

[54] METHOD FOR MAKING DYNAMIC RANDOM ACCESS MEMORY CELLS HAVING BRUSH-SHAPED STACKED CAPACITORS PATTERNED FROM A HEMISPHERICAL GRAIN HARD MASK

[75] Inventor: Li Yeat Chen, Hsinchu, Taiwan

[73] Assignee: Vanguard International Semiconductor Corporation, Hsin-Chu, Taiwan

[21] Appl. No.: 09/066,018

[22] Filed: Apr. 24, 1998

[51] Int. Cl.[7] .................................................. H01L 21/8242
[52] U.S. Cl. ........................... 438/255; 438/398; 257/309
[58] Field of Search ..................................... 438/253, 254, 438/255, 397, 398

[56] References Cited

U.S. PATENT DOCUMENTS

| | | | |
|---|---|---|---|
| 5,134,086 | 7/1992 | Ahn ......................................... | 438/398 |
| 5,256,587 | 10/1993 | Jun et al. ................................ | 438/253 |
| 5,342,800 | 8/1994 | Jun .......................................... | 438/396 |
| 5,432,116 | 7/1995 | Keum et al. ............................ | 438/397 |
| 5,492,848 | 2/1996 | Lor et al. ................................ | 438/396 |
| 5,858,837 | 1/1999 | Sakoh et al. ............................ | 438/255 |

OTHER PUBLICATIONS

Y.K. Jun. "The Fabrication and Electrical Properties of Modulated Stacked Capacitor for Advanced DRAM Applications", IEEE Electron Device Letters, vol. 13, No. 8, Aug. 1992, p. 430–432.

*Primary Examiner*—Olik Chaudhuri
*Assistant Examiner*—William David Coleman
*Attorney, Agent, or Firm*—George O. Saile; Stephen B. Ackerman

[57] ABSTRACT

An array of DRAM cells having brush-shaped stacked capacitors with increased capacitance is achieved. A first planar insulating layer is formed having openings over the FET source/drain areas for node contacts. A doped first polysilicon layer and a silicide layer are deposited and patterned to form bit lines and concurrently form the capacitor node contacts in the openings. A planar second insulating layer is deposited with second openings aligned over the node contacts. A multilayer composed of a doped second polysilicon layer, an etch end-stop layer (silicide or undoped polysilicon), a thick doped third polysilicon layer, and a thin insulating layer is deposited and patterned to form the capacitor bottom electrodes. A thin hemispherical-shaped grain (HSG) fourth polysilicon layer is deposited and used as an etch mask to form a sieve-like mask in the third insulating layer on the top of the bottom electrode. The sieve-like mask is then used to anisotropicaly etch the bottom electrode to the etch-stop layer without overetch to form a brush-like electrode while retaining the HSG layer on the sidewalls of the bottom electrodes to increase capacitor area. An interelectrode dielectric layer and a doped fifth polysilicon layer are deposited and patterned to complete the improved stacked capacitors for the DRAM devices.

32 Claims, 6 Drawing Sheets

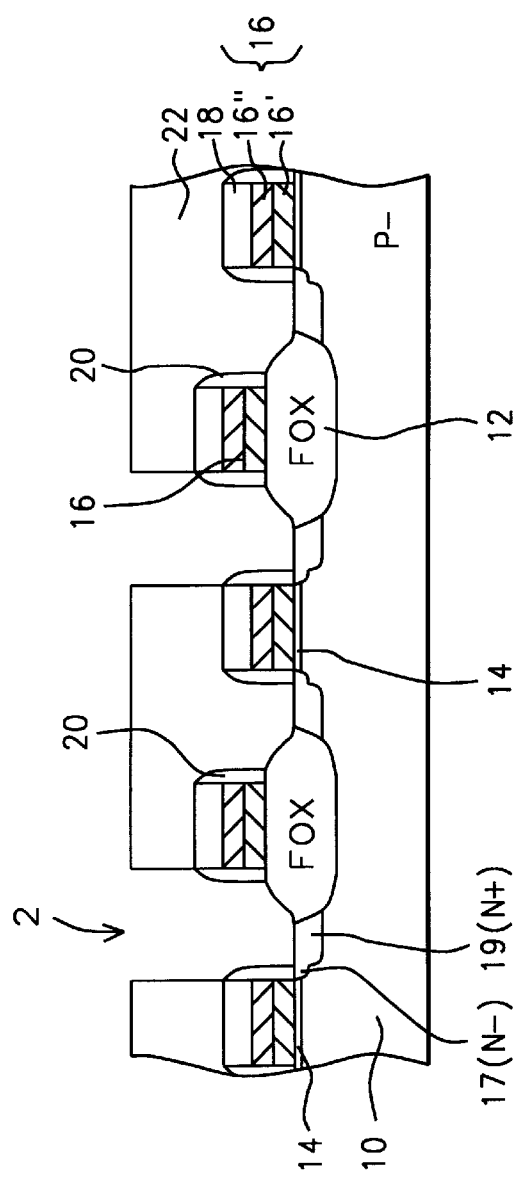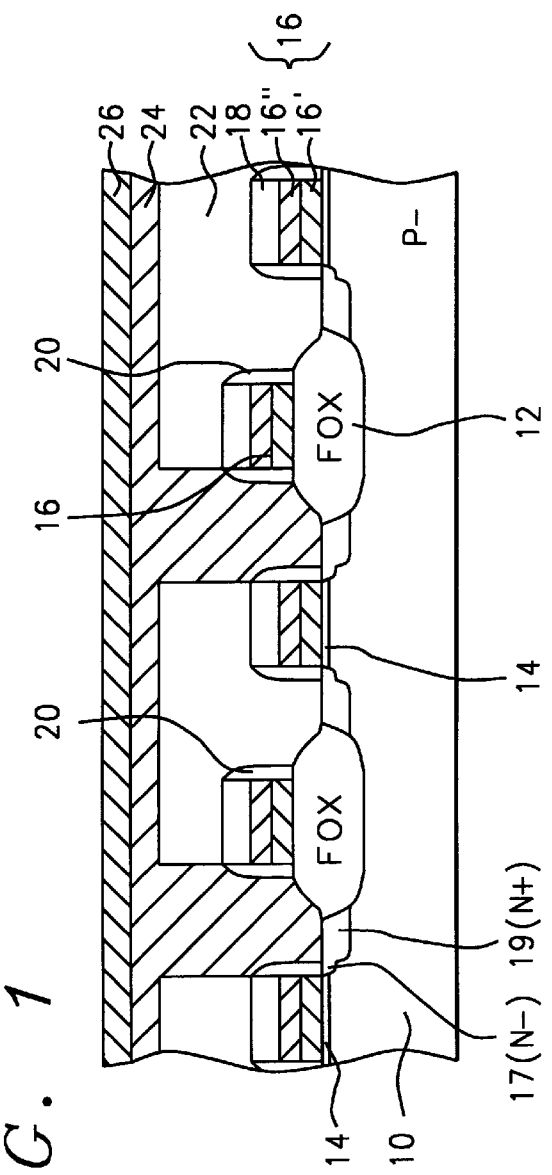

METHOD FOR MAKING DYNAMIC RANDOM ACCESS MEMORY CELLS HAVING BRUSH-SHAPED STACKED CAPACITORS PATTERNED FROM A HEMISPHERICAL GRAIN HARD MASK

BACKGROUND OF THE INVENTION

(1) Field of the Invention

The present invention relates to semiconductor integrated circuits, and more particularly to a method for fabricating an array of dynamic random access memory (DRAM) cells with brush-shaped stacked capacitors to increase the capacitance. The brush-shaped capacitors are formed from a hemispherical grain polysilicon layer that is used as a hard mask to increase the surface area of the capacitor bottom electrodes.

(2) Description of the Prior Art

Dynamic random access memory (DRAM) circuits (devices) are used extensively in the electronics industry, and more particularly in the computer industry for storing data in binary form (1 and 0) as charge on a storage capacitor. These DRAM devices are made on semiconductor substrates (or wafers) and then the substrates are diced to form the individual DRAM circuits (or DRAM chips). Each DRAM circuit (chip) consists in part of an array of individual DRAM storage cells that store binary data (bits) as electrical charge on a storage capacitor. Further, the information is stored and retrieved from the storage capacitor by means of switching a single access transistor (via word lines) on or off in each memory cell using peripheral address circuits, while the charge stored on the capacitor is sensed by means of bit lines and by read/write circuits formed on the periphery of the DRAM chip.

The access transistor for the DRAM device is usually a field effect transistor (FET), and the single capacitor in each cell is either formed in the semiconductor substrate as a trench capacitor, or built over the FET in the cell area as a stacked capacitor. To maintain a reasonable. DRAM chip size and improved circuit performance, it is necessary to further reduce the area occupied by the individual cells on the DRAM chip. Unfortunately, as the cell size decreases, it becomes increasing more difficult to fabricate stacked or trench storage capacitors with sufficient capacitance to store the necessary charge to provide art acceptable signal-to-noise level for the read circuits (sense amplifiers) to detect. The reduced charge also requires more frequent refresh cycles that periodically restore the charge on these volatile storage cells. This increase in refresh cycles further reduces the performance (speed) of the DRAM circuit.

Since the capacitor area is limited to the cell size in order to accommodate the multitude of cells on the DRAM chip, it is necessary to explore alternative methods for increasing the capacitance without increasing the lateral area that the capacitor occupies on the substrate surface. In recent years the method of choice is to build stacked capacitors over the access transistors within each cell area, rather than forming trench capacitors that need to be etched to increasing depths in the substrate to maintain the necessary capacitance. The stacked capacitors also provide increased latitude in capacitor design and processing while reducing cell area. More specifically, the stacked capacitors can be extended in the vertical direction (third dimension) to increase the stacked capacitor area, and therefore to increase the capacitance.

Many methods of making DRAM circuits using stacked capacitors have been reported in the literature. One method is to use polysilicon Hemispherical Shaped Grains (HSG) as a mask to etch deep vertical grooves in a capacitor bottom electrode. This MOdulated STacked (MOST) capacitor is described by Jun et al. in an article entitled "The Fabrication and Electrical Properties of Modulated Stacked Capacitors for Advanced DRAM Applications," IEEE Electron Device Letters, Vol. 13, No. 8, Aug. 1992, pages 430–432. Other methods in which hyperfine patterns are etched in the capacitor electrode using HSG structures are also taught by Jun et al. in U.S. Pat. No. 5,256,587 and by Jun in U.S. Pat. No. 5,342,800. Another method is described by Ahn, in U.S. Pat. No. 5,134,086 in which an HSG structure is replicated in a thin oxide mask over a polysilicon capacitor node electrode. The mask is then used to selectively etch the node electrode to increase the surface area.

There has been considerable work done to increase the capacitance area using hemispherical grain structures as etch masks to increase the area of the capacitor. However, it is still desirable to further improve on these capacitors using the hemispherical grain (HSG) structure as a hard mask, and including portions of the HSG structure in the capacitor to further increase the capacitance.

SUMMARY OF THE INVENTION

Accordingly, it is a principal object of the present invention to fabricate brush-shaped stacked capacitors having increased capacitance for high-density DRAM devices.

Another object of this invention is to form these stacked capacitors using a hemispherical-shaped grain (HSG) layer to pattern an oxide mask on the top surface of the node (or bottom) electrode to selectively etch deep grooves while retaining the HSG layer on the sidewalls of the node electrode to further increase the surface area, thereby increasing the capacitance.

The method for making these DRAM devices with brush-shaped stacked capacitors with increased capacitance begins by providing a semiconductor substrate. Typically the substrate is a single-crystal silicon substrate doped with a P type conductive dopant, such as boron (B). A relatively thick Field OXide (FOX) is formed surrounding and electrically isolating each device area. The field oxide is typically formed using the LOCal Oxidation of Silicon (LOCOS) metthod, in which a patterned silicon nitride ($Si_3N_4$) layer is used to mask the device areas from oxidation while the silicon substrate in the FOX areas is thermally oxidized to the desired thickness. Other field oxide isolations can also be used, such as shallow trench isolation (STI) and the like. A thin gate oxide is then formed in the device areas of the silicon substrate for the FETs. Then a gate electrode polycide (polysilicon/silicide) layer, having a cap oxide ($SiO_2$) thereon, is patterned to form the FET gate electrodes and the interconnecting word lines for the array of memory cells on the DRAM device, and also serves as the word lines over the FOX. Typically for DRAM memory cells the access transistor in each memory cell is an N-channel FET. Next, lightly doped source/drain regions, self-aligned to the FET gate electrodes, are formed by ion implantation. A spacer silicon oxide ($SiO_2$) layer is deposited and anisotropically etched back to form spacers on the sidewalls of the gate electrodes. Source/drain contact regions are formed next in the device areas adjacent to the insulating sidewall spacers by a second ion implantation to complete the FETs in each of the memory cells.

The brush-shaped capacitors are formed using the next sequence of processing steps. A first insulating layer is deposited over the device areas and over the field oxide areas. The first insulating layer is composed of silicon oxide (SiO$_2$) and deposited by low-pressure chemical vapor deposition (LPCVD). The first insulating layer is then planarized, for example by chemical/mechanical polishing (CMP). Conventional photolithographic techniques and anisotropic plasma etching are used to etch first openings in the first insulating layer to the source/drain contact areas where electrical contacts are desired for the array of stacked capacitors. A first polysilicon layer which is in-situ doped N$^+$ with phosphorus (P) is deposited on the first insulating layer and fills the first openings to provide node contacts and also to serve as landing pads for the stacked capacitors. A silicide layer, such as tungsten silicide (WSi$_2$) is then deposited on the first polysilicon layer to form a polycide layer. The polycide layer is patterned by photoresist masking and anisotropic plasma etching to the first insulating layer to form bit lines, while removing the polycide over the first openings and leaving portions of the first polysilicon layer in the first openings. The polysilicon left in the first openings provides node contacts to the source/drain contact areas for the stacked capacitors, and will later serve as landing pads for etching second contact openings without misalignment. A second insulating layer is deposited over the bit lines and over the portions of the first polysilicon layer in the first openings. The second insulating layer is then planarized by chemical/mechanical polishing (CMP). Second openings are etched in the second insulating layer to the first polysilicon layer (landing pads) in the first openings. An in-situ N$^+$ doped second polysilicon layer is deposited over the second insulating layer and is sufficiently thick to completely fill the second openings. By a key feature of this invention an etch endpoint detect layer is deposited. Preferably the etch endpoint detect layer consists of an undoped polysilicon layer or a silicide layer. For example, the silicide layer can be a refractory metal silicide such as WSi$_2$. A relatively thick in-situ N$^+$ doped third polysilicon layer is deposited on the etch endpoint detect layer, and a third insulating layer, such as SiO$_2$ is deposited on the third polysilicon layer. The multilayer composed of the third insulating layer, the third polysilicon layer, the etch endpoint detect layer, and the second polysilicon layer is then patterned to the second insulating layer thereby leaving portions of the multilayer over the second openings for forming the capacitor bottom electrodes for the stacked capacitors. A relatively thin conformal fourth polysilicon layer is deposited under deposition conditions which result in a layer of hemispherical-shaped grains (HSGs). The HSG layer is sufficiently thin to leave openings between the hemispherical-shaped grains. The hemispherical-shaped grains are also formed on the sidewalls of the patterned third polysilicon layer which is used to form the bottom electrodes for the stacked capacitors. The HSG layer is then used as an etch mask to pattern the relatively thin third insulating layer between the HSGs to form a sieve-like hard mask that is later used for forming the brush-shaped stacked capacitors. The sieve-like hard mask is then used to selectively etch the third polysilicon layer to the etch endpoint detect layer to form a brush- or bristle-like structure in the third polysilicon layer that makes up the bottom electrodes. The HSGs are also retained on the sidewalls of the bottom electrodes to further increase the surface area for the capacitors. Optical emission spectroscopy and the etch endpoint detect layer are used to prevent overetching the third polysilicon layer. During the plasma etching of the third polysilicon layer to form the brush-shaped structure, the HSG layer between the bottom electrodes is selectively etched to the second insulating layer to form an array of electrically isolated bottom electrodes. A thin interelectrode dielectric (ILD) layer having a high dielectric constant is deposited on the bottom electrodes. For example, SiO$_2$/Si$_3$N$_4$/SiO$_2$ (ONO) or tantalum pentoxide (TaO$_5$) and other high dielectric materials can be used for the ILD layer to further increase capacitance. The array of brush-shaped stacked capacitors is then completed by depositing and patterning an N$^+$ doped fifth polysilicon layer to form the top electrodes for the capacitors.

BRIEF DESCRIPTION OF THE DRAWINGS

The objects and advantages of this invention are best understood with reference to the attached drawings in FIGS. 1 through 7, and the embodiment that follows.

FIGS. 1 through 7 show schematic cross-sectional views through a portion of a DRAM chip having two memory cells and illustrating the fabrication steps for making the brush-shaped stacked storage capacitor by the method of this invention.

DESCRIPTION OF THE PREFERRED EMBODIMENT

Figure 3:
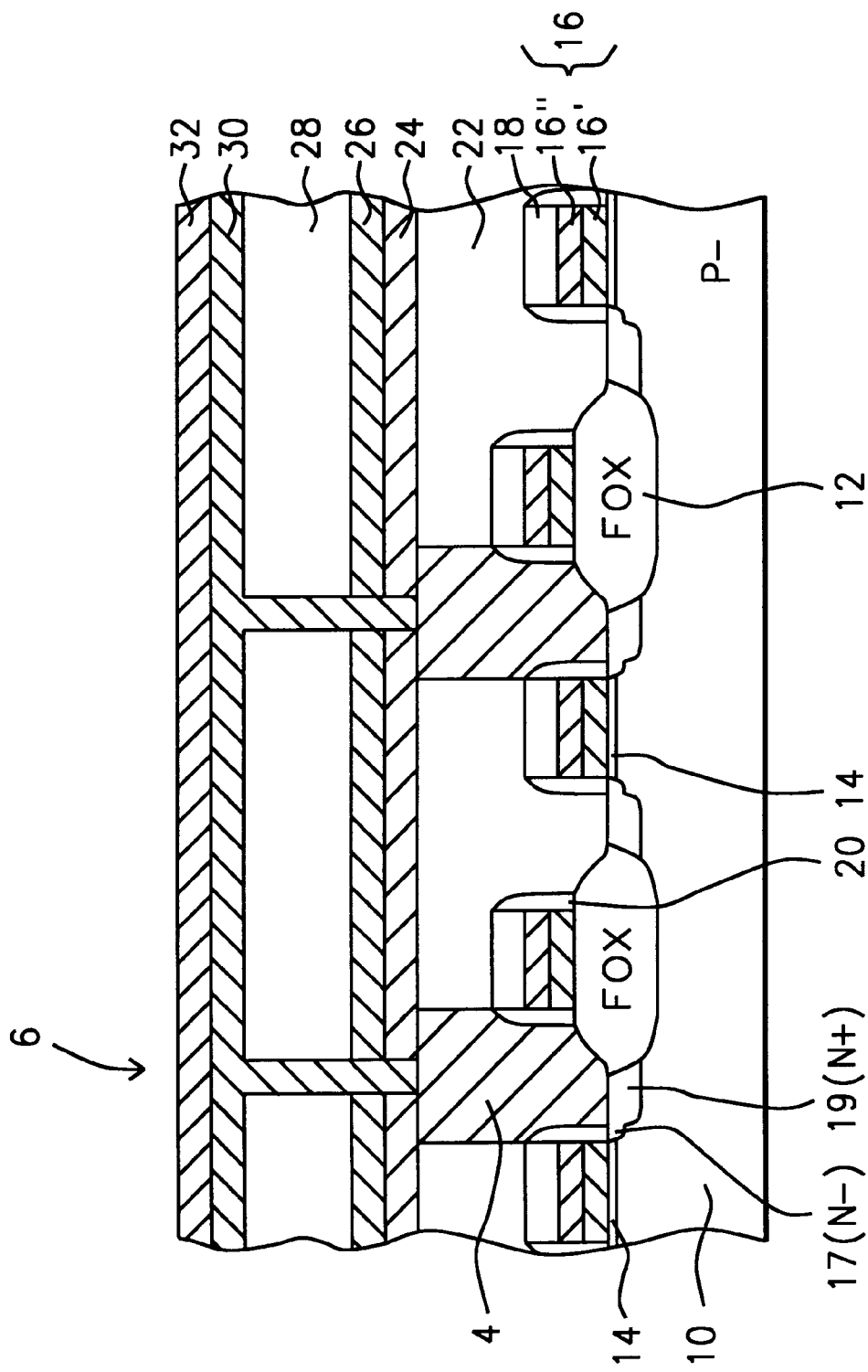

The method for making the DRAM cells having these improved brush-shaped capacitors is now described in detail. However, it should also be well understood by one skilled in the art that by including additional process steps, in addition to those described in this embodiment, other types of devices can also be included on the DRAM chip. For example, by forming N-well regions in a P doped substrate, P-channel FETs can also be provided from which Complementary Metal-Oxide-Semiconductor (CMOS) circuits can also be formed, such as are used for the peripheral circuits on the DRAM chip.

Referring now to FIG. 1, a schematic cross-sectional view of a portion of a semiconductor substrate 10 is shown having a partially completed DRAM cell with a pass transistor (N-FET) formed on and in the substrate surface. The preferred substrate 10 is composed of a lightly doped P type single-crystal silicon having a <100> crystallographic orientation. A relatively thick Field OXide (FOX) 12 is formed to surround and electrically isolate the individual device regions in which the memory cells are built. The field oxide 12 is commonly formed by the LOCal Oxidation of Silicon (LOCOS) method. Briefly the LOCOS method uses a thin SiO$_2$ (pad oxide) as a stress release layer, and a thicker silicon nitride (Si$_3$N$_4$) layer that serves as an oxidation barrier layer on the pad oxide on the substrate surface. The pad oxide and the Si$_3$N$_4$ are not shown in FIG. 1. Conventional photolithographic techniques and etching are used to remove the Si$_3$N$_4$ barrier layer in areas where a field oxide is required, while the Si$_3$N$_4$ is retained over the active device areas to prevent oxidation. The silicon substrate is then thermally oxidized to form the field oxide areas 12 shown in FIG. 1. The FOX is usually grown to a thickness of between about 3000 and 6000 Angstroms, and the silicon nitride barrier layer and pad oxide are removed in a wet/etch. For example, the nitride can be removed in a hot phosphoric acid (H$_3$PO$_4$) etch, and the pad oxide can be removed in a dilute solution of hydrofluoric acid and water (HF/H$_2$O). Other field oxide isolation methods can be used that allow even more closely spaced device areas and higher cell density. For example shallow trench isolation (STI) and the like can be used with this invention.

An array of access transistors (N-channel FETs) is now formed in the active device regions. Referring now to FIG. 1, the surface of the silicon substrate 10 in the device area is thermally oxidized to form a thin gate oxide 14 for the N-channel FET. The gate oxide 14 is grown to a thickness of between about 60 and 120 Angstroms. A polysilicon layer 16' is deposited by low pressure chemical vapor deposition (LPCVD) to a thickness of between about 500 and 1000 Angstroms. Layer 16' is doped $N^+$ with arsenic (As) or phosphorus (P) to a concentration of between about 1.0 E 19 and 1.0 E 21 atoms/cm$^3$. Next a refractory metal silicide layer 16", such as tungsten silicide ($WSi_2$), is deposited by LPCVD, using tungsten hexafluoride ($WF_6$) and silane ($SiH_4$), to a thickness of between about 800 and 1500 Angstroms. A cap oxide 18 composed, for example, of $SiO_2$ is deposited by LPCVD using a reactant gas such as tetraethosiloxane (TEOS), typically to a thickness of between about 500 and 2000 Angstroms. Layers 18, 16", and 16' are then patterned to form the FET gate electrodes 16 over the device areas and to also form the interconnecting word lines, also labeled 16, over the field oxide 12 for the DRAM cells.

Still referring to FIG. 1, source/drain regions are formed adjacent to the gate electrodes and typically include lightly doped source/drain regions to minimize short-channel effects for sub-half-micron channel FETs. The lightly doped source/drain regions 17($N^-$) are formed first by ion implantation and are self-aligned to the FET gate electrodes 16. The lightly doped source/drain regions 17($N^-$) for N-channel FETs, typically used as the access transistor in DRAM cells, are formed by implanting an N type dopant, such as As or P. For example, a typical implant might consist of phosphorus p$^{31}$ at a dose of between about 1 E 13 and 1 E 14 atoms/cm$^2$ and at an energy of between about 20 and 40 KeV. The gate electrodes serve as an implant mask to self-align the lightly doped source/drain regions 17($N^-$) to the gate electrodes, while an additional patterned photoresist can be used to prevent implantation elsewhere on the substrate where it is not required.

Sidewall spacers 20 are formed on the sidewalls of the gate electrode 16, as shown in FIG. 1. Typically the sidewall spacers 20 are formed by depositing a conformal low-temperature spacer silicon oxide, such as a TEOS oxide, and anisotropically blanket etching back the oxide to the surface of the substrate 10. For example, the spacer oxide can be deposited using LPCVD and a reactant gas such as TEOS/ozone at a temperature in the range of about 650 to 900° C. The etchback is carried out in a reactive ion etcher (RIE) or high-density plasma (HDP) etcher using an etching gas such as trifluoromethane ($CHF_3$). An $N^+$ source/drain ion implantation is then used to complete the source/drain regions by forming the $N^+$ doped source/drain contact regions 19($N^+$) aligned to the sidewall spacers 20, and therefore also aligned to the lightly doped source/drain regions 17, as shown in FIG. 1. This completes the FET, which serves as the access transistor in each of the memory cell areas.

Continuing with FIG. 1, a first insulating layer 22 is deposited over the device areas and the field oxide areas 12. Preferably the first insulating layer is composed of silicon oxide ($SiO_2$). For example, layer 22 can be deposited by LPCVD, and is deposited to a thickness of between about 3000 and 4500 Angstroms. The first insulating layer 22 is then planarized. One method of globally planarizing layer 22 is to use chemical/mechanical polishing (CMP) using an appropriate polishing slurry. Alternatively, a low-temperature glass, such as borophosphosilicate glass (BPSG) can be used as the first insulating layer 22 and locally planarized by thermal annealing.

Referring still to FIG. 1, first openings 2 are etched in the first insulating layer 22 to the source/drain contact areas 19($N^+$) to provide openings for the node contacts for the stacked capacitors. The openings 2 are etched using conventional photolithographic techniques and anisotropic plasma etching. For example, the plasma etching can be carried out using a high-density plasma (HDP) etcher and an etchant gas, such as $CHF_3$ or $CF4/H_2$, that etches selectively the $SiO_2$ to silicon.

Referring now to FIGS. 2, a first polysilicon layer 24 is deposited on the top surface of the insulating layer 22 and sufficiently thick to fill the openings 2, and more specifically to a thickness of between about 500 and 1000 Angstroms. Preferably layer 24 is deposited by LPCVD using $SiH_4$, and :Ls in-situ doped $N^+$ with phosphorus (P) using phosphine ($PH_3$) to provide the node contacts. Layer 24 is doped to a preferred concentration of between about 1.0 E 19 and 1.0 E 21 atoms/cm$^3$. Layer 24 also serves as landing pads for aligning second openings that are later etched for the stacked capacitors. A silicide layer 26, such as tungsten silicide ($WSi_2$) is then deposited on the first polysilicon layer 24 to form a polycide layer composed of layers 24 and 26. Layer 26 is deposited preferably by LPCVD using tungsten hexafluoride ($WF_6$) and $SiH_4$, and is deposited to a thickness of between about 800 and 1500 Angstroms.

Referring to FIG. 3, the polycide layer composed of layers 24 and 26 is then patterned by photoresist masking and anisotropic plasma etching to the first insulating layer 22 to form bit lines. Concurrently the polysilicon layer 24 is etched over the first openings 2 leaving portions of the $N^+$ doped first polysilicon layer in the first openings 2 to form the node contacts 4 for the stacked capacitors, and will later serve as landing pads for etching second contact openings without misalignment. A second insulating layer 28 is deposited over the bit lines and over the portions of the first polysilicon layer in the first openings 2. Layer 28 is preferably $SiO_2$ or BPSG oxide and is deposited by LPCVD using, for example, TEOS/ozone, and for the BPSG by including appropriate dopant gases containing phosphorus and boron. Layer 28 is deposited to a preferred thickness of between about 4500 and 8000 Angstroms and is planarized, for example, by chemical/mechanical polishing (CMP). The patterned bit lines lie behind the node contacts 4 in FIG. 3, and therefore are depicted by dashed lines.

Still referring to FIG. 3, photoresist masking and anisotropic plasma etching are used to etch second openings 6 in the second insulating layer 28 to the node contacts 4 formed from the first polysilicon layer 24 (landing pads) in the first openings 2. Next, an in-situ $N^+$ doped second polysilicon layer 30 is deposited over the second insulating layer 28 aid is sufficiently thick to completely fill the second openings 6, and more specifically is deposited to a thickness of between about 3500 and 4000 Angstroms. Layer 30 is deposited preferably by LPCVD using a reactant gas such as $SiH_4$, and is in-situ doped with phosphorus to a concentration of between about 1.0 E 19 and 1.0 E 21 atoms/cm$^3$.

A key feature of this invention is to deposit an etch endpoint detect layer 32. Preferably the etch endpoint detect layer consists of a silicide layer. Alternatively, layer 32 can be an undoped polysilicon layer. Preferably silicide layer 32 can be a refractory metal silicide such as $WSi_2$ and is deposited by LPCVD using $WF_6$ and $SiH_4$ as the reactant gases. Preferably layer 32 is deposited to a thickness sufficient to serve as an etch endpoint detect layer. For example, one method of detection is by optical emission spectroscopy, which has a high sensitivity. The technique measures the emission intensity of the characteristic optical radiation (spectra) from the reactant products in the plasma during plasma etching. Layer 32 is deposited, more specifically, to a thickness of between about 500 and 1000 Angstroms.

Figure 4:
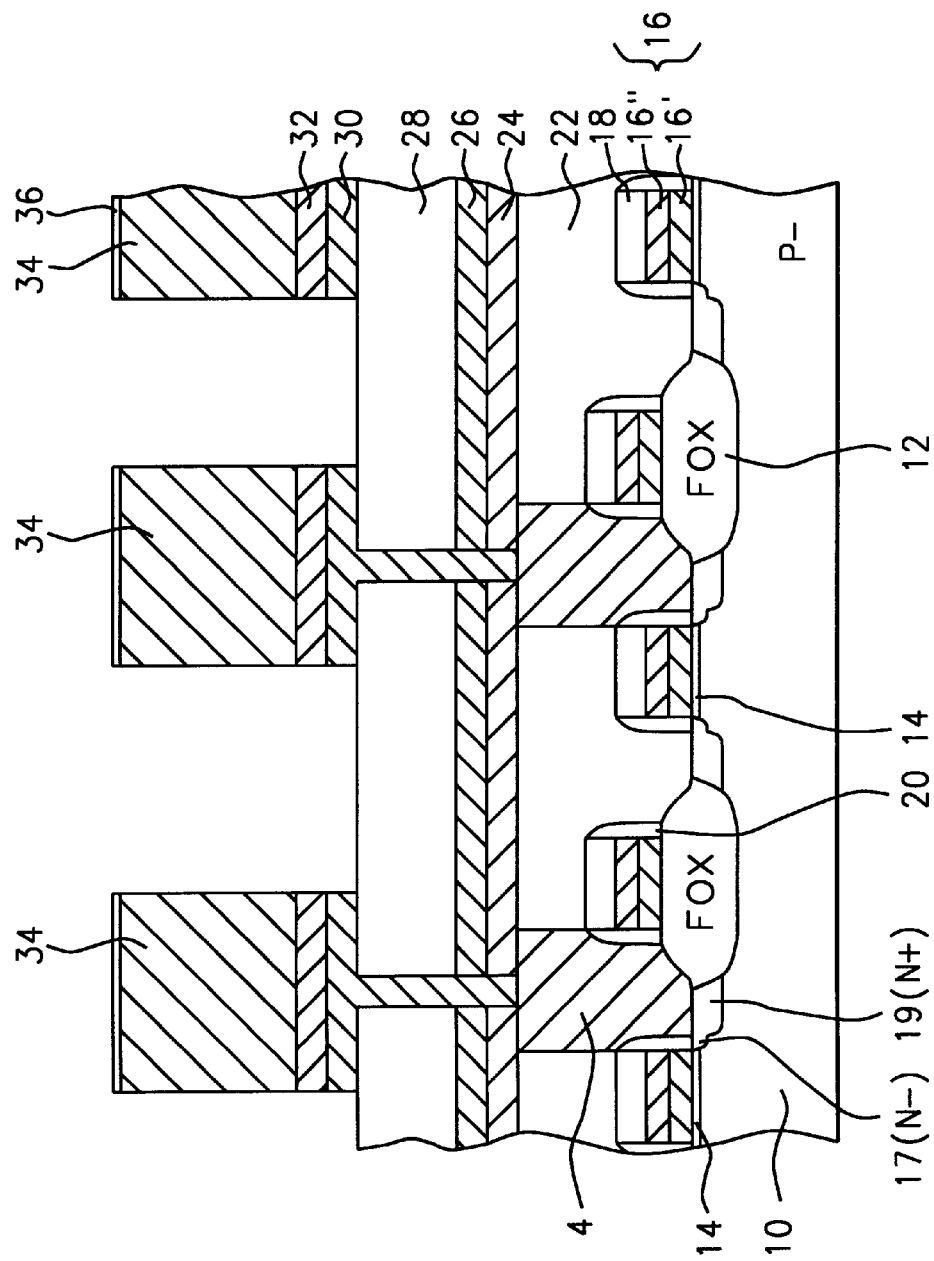

Referring to FIG. 4 and continuing with the process, a relatively thick in-situ $N^+$ doped third polysilicon layer 34 is deposited on the etch endpoint detect layer 32. Preferably layer 34 is deposited by LPCVD, using a reactant gas such as $SiH_4$, and is doped with P to a concentration of between about 1.0 E 19 and 1.0 E 21 atoms/cm$^3$. Layer 34 is deposited to a preferred thickness of between about 7000 and 9000 Angstroms. Next, a relatively thin third insulating layer 36, such as $SiO_2$, is deposited on the third polysilicon layer 34. Layer 36 is deposited LPCVD using TEOS as the reactant gas. Alternatively, layer 36 can be a silicon oxynitride (SiON). The thickness of layer 36 is between about 300 and 800 Angstroms, and later serves as a hard mask in conjunction with a hemispherical-shaped grain (HSG) layer for forming the brush-shaped stacked capacitors.

Still referring to FIG. 4, a photoresist mask and anisotropic plasma etching are used to pattern the multilayer composed of the third insulating layer 36, the third polysilicon layer 34, the etch endpoint detect layer 32, and the second polysilicon layer 30 to the second insulating layer 28 to form the array of bottom electrodes for the capacitors over the second openings 6.

Figure 5:
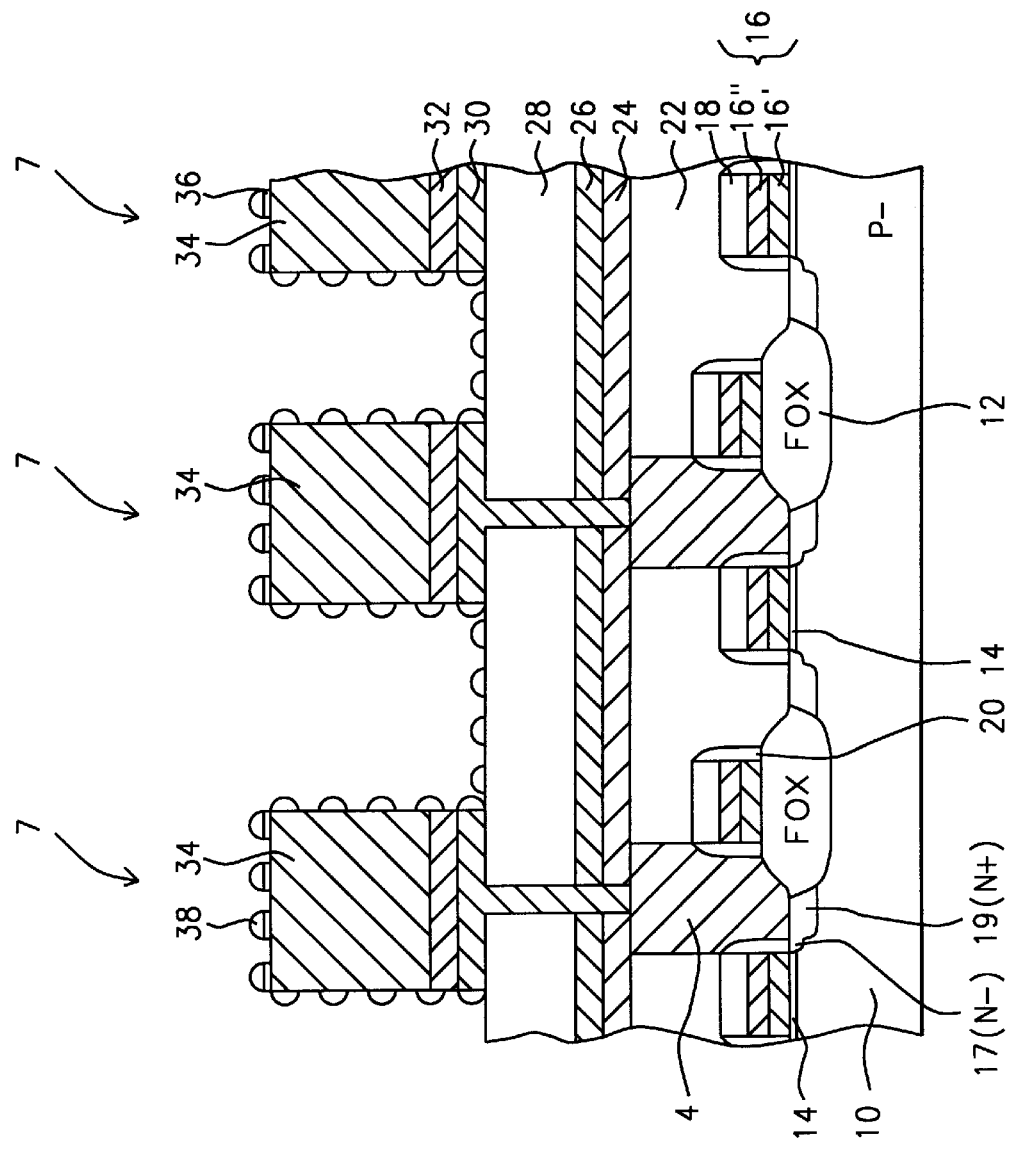

Referring next to FIG. 5, a hemispherical-shaped grain (HSG) layer 38 is formed by depositing a relatively thin conformal fourth polysilicon layer. Preferably the fourth polysilicon layer is deposited using a reactant gas of $SiH_4$ or $Si_2H_6$ at a reduced pressure of between about 0.01 and 1.0 torr, and at a temperature of between about 560 and 590° C., and more specifically at a temperature with initial nucleation rates in the polysilicon layer that result in grain sizes that are between about 0.05 and 0.20 micrometers (um). Layer 38 has a preferred thickness of between about 300 and 800 Angstroms. The HSG layer is sufficiently thin to leave openings between the hemispherical-shaped grains. The HSG layer 38 is then used as an etch mask to etch the relatively thin third insulating layer 36 between the HSGs to form a sieve-like hard mask 7 on the top of the capacitor bottom electrodes. Preferably the $SiO_2$ third insulating layer 36 is anisotropically plasma etched using an etchant gas such as $CHF_3$ which provides a high etch-rate selectivity of $SiO_2$ to polysilicon. The patterned sieve-like hard mask 7, composed of the $SiO_2$ layer 36, is now used to form the brush-shaped bottom electrodes for the stacked capacitors.

Figure 6:
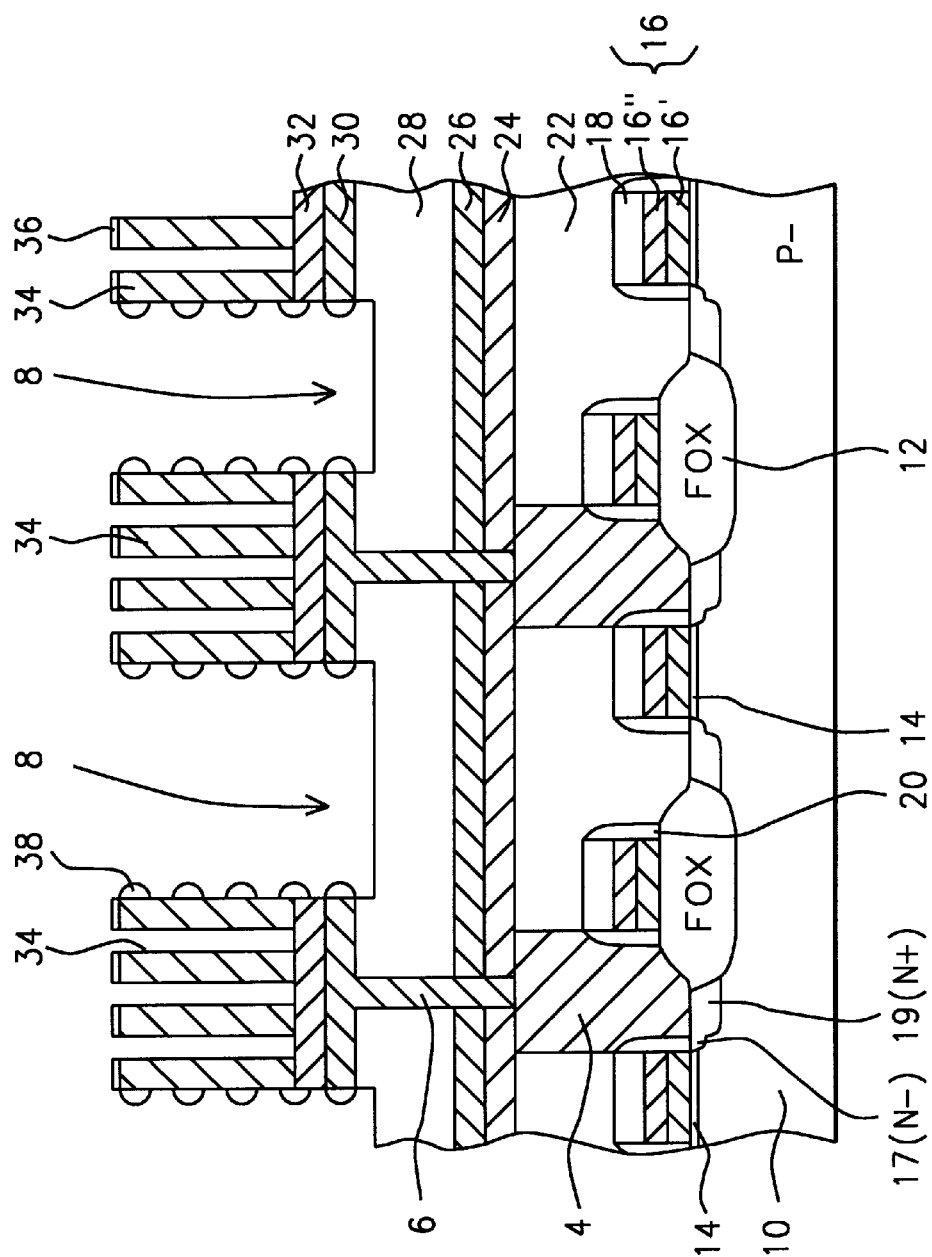

Referring to FIG. 6, a blanket anisotropic plasma etching is carried out to selectively etch the patterned thick third polysilicon layer 34 to form brush-shaped bottom electrodes using the sieve-like hard mask 7. The etching is carried out to provide a high etch-rate selectivity of polysilicon to $SiO_2$, having an etch-rate ratio of polysilicon to $SiO_2$ of about 200:1. For example, the etching can performed in a HDP etcher using an etchant gas, such as chlorine ($Cl_2$), hydrogen bromide (HBr), and oxygen ($O_2$). The etch endpoint detect layer 32 is an important feature of this invention because the etching of the third polysilicon layer 34 can be accurately terminated using an etch endpoint method such as optical emission spectroscopy. This prevents overetching the bottom electrodes into layer 30, which Lakes electrical contact to the node contacts 4 through the second openings 6. Concurrently the anisotropic plasma etching also removes selectively the HSG layer 38 in the regions 8 on the second insulating layer 28 between the bottom electrodes to form the array of electrically isolated bottom electrodes. The HSG layer 38 is also retained on the sidewalls of the bottom electrodes to further increase the surface area for the capacitors. The hard mask 7, composed of the $SiO_2$ layer 36, is removed selectively using, for example, a hydrofluoric (HF) acid solution.

Figure 7:
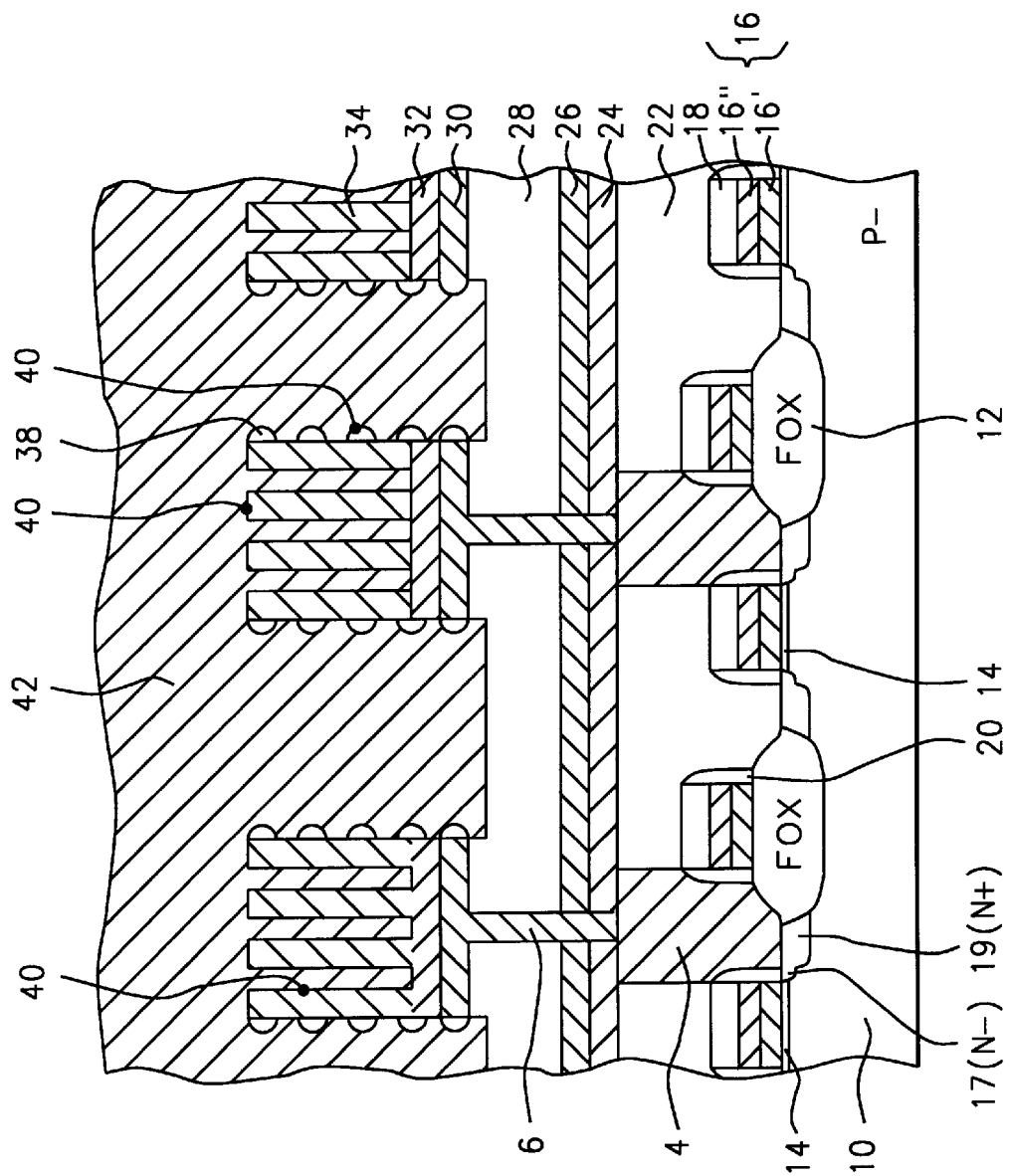

Referring now to FIG. 7, the array of capacitors is now completed by forming a thin interelectrode dielectric layer 40 having a high dielectric constant on the surface of the bottom electrodes having the brush-shaped structure composed of the polysilicon layer 34 and the HSG layer 38 on the sidewalls. This very thin dielectric layer is not explicitly depicted in FIG. 7 as a separate layer. Layer 40 is preferably composed of $SiO_2/Si_3N_4/SiO_2$ (ONO). The ONO dielectric can be formed by growing a thermal oxide on the polysilicon bottom electrodes, depositing a $Si_3N_4$ layer by LPCVD, and then using an oxidation furnace to form the top $SiO_2$ by partially reducing the Si3N4 layer. Preferably the ONO is formed having a thickness of between about 52 and 60 Angstroms. Alternatively, layer 40 can be composed of other high-dielectric constant materials, such as tantalum pentoxide ($Ta_2O_5$) or can be used in conjunction with ONO to form the high-dielectric-constant layer 40.

Also shown in FIG. 7, a conformal, in-situ doped fifth polysilicon layer 42 is deposited, for example by LPCVD using a reactant gas such $SiH_4$, and using a dopant gas such as $PH_3$. Layer 42 is doped N$^+$ to a preferred concentration of between about 1.0 E 19 and 1.0 E 21 atoms/cm$^3$. The preferred thickness of layer 42 is between about 1000 and 1500 Angstroms. The fifth polysilicon layer 42 is then patterned to form the top electrodes 42 to complete the array of dynamic random access memory (DRAM) cells having these novel brush-shaped stacked capacitors with HSG sidewalls that increase the capacitance.

While the invention has been particularly shown and described with reference to the preferred embodiment thereof, it will be understood by those skilled in the art that various changes in form and details may be made without departing from the spirit and scope of the invention.

What is claimed is:

1. A method for fabricating an array of brush-shaped stacked capacitors on dynamic random access memory (DRAM) devices comprising the steps of:

forming field oxide areas on a semiconductor substrate while leaving device areas for fabrication of semiconductor devices;

forming said semiconductor device structures in and on said device areas of said semiconductor substrate;

depositing a first insulating layer over said device areas and said field oxide areas;

planarizing said first insulating layer;

forming first openings in said first insulating layer to said device areas where electrical contacts are desired for said array of stacked capacitors;

depositing a first polysilicon layer on said first insulating layer and filling said first openings;

depositing a silicide layer on said first polysilicon layer to form a polycide layer;

patterning by photoresist masking and selective anisotropic plasma etching said polycide layer to said first insulating layer to form bit lines while leaving portions of said first polysilicon layer in said first openings to provide node contacts to said device areas for said stacked capacitors, and to serve as landing pads;

depositing a second insulating layer over said bit lines and over said first polysilicon layer in said first openings;

planarizing said second insulating layer;

forming second openings in said second insulating layer to said first polysilicon layer in said first openings;

depositing a second polysilicon layer and filling said second openings;

depositing an etch endpoint detect layer on said second polysilicon layer;

depositing a thick third polysilicon layer on said etch endpoint detect layer;

depositing a third insulating layer on said third polysilicon layer;

patterning said third insulating layer, said third polysilicon layer, said etch endpoint detect layer, and said second polysilicon layer to said second insulating layer thereby leaving portions over said second openings for bottom electrodes of said stacked capacitors;

forming a layer of hemispherical-shaped grains (HSGs) from a conformal fourth polysilicon layer sufficiently thin to leave openings between said hemispherical-shaped grains, and further said hemispherical-shaped grains formed on the sidewalls of said bottom electrodes;

plasma etching said third insulating layer between said hemispherical-shaped grains to said third polysilicon layer on top surface of said bottom electrodes while retaining said hemispherical-shaped grains on said sidewalls;

anisotropic plasma etching said third polysilicon layer to said etch endpoint detect layer using said third insulating layer as a hard mask, and further removing said hemispherical-shaped grains between said bottom electrodes and forming an array of said bottom electrodes for said array of brush-shaped stacked capacitors;

forming an interelectrode dielectric layer on said bottom electrodes;

depositing and patterning a fifth polysilicon layer to form top electrodes thereby completing said array of brush-shaped stacked capacitors for said DRAM devices.

2. The method of claim 1, wherein said first insulating layer is composed of silicon oxide ($SiO_2$) and has a thickness of between about 3000 and 4500 Angstroms.

3. The method of claim 1, wherein said first polysilicon layer is in-situ $N^+$ doped with phosphorus to a (concentration of between about 5.0 E 19 and 6.0 E 20 atoms/cm$^3$.

4. The method of claim 1, wherein said first polysilicon layer is deposited to a thickness of between about 500 and 1500 Angstroms.

5. The method of claim 1, wherein said silicide layer is tungsten silicide and is deposited to a thickness of between about 800 and 1500 Angstroms.

6. The method of claim 1, wherein said second insulating layer is silicon oxide ($SiO_2$) and has a thickness between about 4000 and 8000 Angstroms.

7. The method of claim 1, wherein said second polysilicon layer is in-situ $N^+$ doped with phosphorus to a concentration of between about 5.0 E 19 and 6.0 E 20 atoms,/cm$^3$, and said second polysilicon layer is deposited to a thickness of between about 300 and 1500 Angstroms.

8. The method of claim 1, wherein said etch endpoint detect layer is a refractory metal silicide and has a thickness of between about 500 and 1000 Angstrom.

9. The method of claim 1, wherein said etch endpoint detect layer is an undoped polysilicon and has a thickness of between about 500 and 1000 Angstrom.

10. The method of claim 1, wherein said third polysilicon layer is in-situ $N^+$ doped with phosphorus to a concentration of between about 1.0 E 19 and 1.0 E 21 atoms/cm$^3$, and said second polysilicon layer has a thickness of between about 7000 and 9000 Angstrom.

11. The method of claim 1, wherein said third insulating layer is silicon oxide deposited by low pressure chemical vapor deposition using tetraethosiloxane (TEOS) to a thickness of between about 300 and 800 Angstroms.

12. The method of claim 1, wherein said third insulating layer is silicon oxynitride (SiON) deposited by plasma enhanced chemical vapor deposition to a thickness of between about 300 and 800 Angstroms.

13. The method of claim 1, wherein said fourth polysilicon layer is deposited using low pressure chemical vapor deposition in a pressure range of about 0.01 to 1.0 torr and at a temperature of between about 560 and 590° C. to form said hemispherical-shaped grains having grain sizes of between about 0.05 and 0.20 micrometers ($\mu$m).

14. The method of claim 1, wherein said interelectrode dielectric layer is silicon oxide/silicon/nitride/silicon oxide (ONO) deposited to a thickness of between about 52 and 60 Angstroms.

15. The method of claim 1, wherein said fifth polysilicon layer is in-situ $N^+$ doped with phosphorus to a concentration of between 1.0 E 19 and 1.0 E 21 atoms/cm$^3$, and said second polysilicon layer has a thickness of between about 7000 and 9000 Angstroms.

16. A method for fabricating a dynamic random access memory (DRAM) device having an array of brush-shaped stacked capacitors comprising the steps of:

providing a semiconductor substrate having field oxide areas in and on said substrate surface surrounding and electrically isolating device areas for field effect transistors (FETs);

forming a gate oxide on said device areas;

depositing a gate electrode polycide layer on said device areas and elsewhere on said field oxide areas;

patterning said gate electrode polycide layer thereby forming gate electrodes over said device areas and word lines elsewhere over said field oxide areas;

doping by ion implantation said device areas adjacent to said gate electrodes and thereby forming lightly doped source/drain regions;

blanket depositing and anisotropically etching back a sidewall spacer insulating layer and thereby forming sidewall spacers on said gate electrodes;

doping by ion implantation said device areas adjacent to said sidewall spacers forming source/drain contact areas and thereby completing said field effect transistors; and further forming capacitors by, depositing a first insulating layer over said device areas and said field oxide areas;

planarizing said first insulating layer;

forming first openings in said first insulating layer to said source/drain contact areas where electrical contacts are desired for said array of stacked capacitors;

depositing a first polysilicon layer on said first insulating layer and filling said first openings;

depositing a silicide layer on said first polysilicon layer to form a polycide layer;

patterning by photoresist masking and selective anisotropic plasma etching said polycide layer to said first insulating layer to form bit lines while leaving portions of said first polysilicon layer in said first openings to provide node contacts to said source/drain contact areas for said stacked capacitors, and to serve as landing pads;

depositing a second insulating layer over said bit lines and over said first polysilicon layer in said first openings;

planarizing said second insulating layer;

forming second openings in said second insulating layer to said first polysilicon layer it said first openings;

depositing a second polysilicon layer and filling said second openings;

depositing an etch endpoint detect layer on said second polysilicon layer;

depositing a thick third polysilicon layer on said etch endpoint detect layer;

depositing a third insulating layer on said third polysilicon layer;

patterning said third insulating layer, said third polysilicon layer, said etch endpoint detect layer, and said second polysilicon layer to said second insulating layer thereby leaving portions over said second openings for bottom electrodes of said stacked capacitors;

forming a layer of hemispherical-shaped grains (HSGs) from a conformal fourth polysilicon layer sufficiently thin to leave openings between said hemispherical-shaped grains, and further said hemispherical-shaped grains formed on the sidewalls of said bottom electrodes;

plasma etching said third insulating layer between said hemispherical-shaped grains to said third polysilicon layer on top surface of said bottom electrodes while retaining said hemispherical-shaped grains on said sidewalls;

anisotropic plasma etching said third polysilicon layer to said etch endpoint detect layer using said third insulating layer as a hard mask, and further removing said hemispherical-shaped grains between said bottom electrodes and forming an array of said bottom electrodes for said array of brush-shaped stacked capacitors, forming an interelectrode dielectric layer on said bottom electrodes;

depositing and patterning a fifth polysilicon layer to form top electrodes thereby completing said array of brush-shaped stacked capacitors for said DRAM devices.

17. The method of claim 16, wherein said first insulating layer is composed of silicon oxide ($SiO_2$) and has a thickness of between about 3000 and 4500 Angstroms.

18. The method of claim 16, wherein said first polysilicon layer is in-situ $N^+$ doped with phosphorus to a concentration of between about 1.0 E 19 and 1.0 E 21 atoms/cm$^3$.

19. The method of claim 16, wherein said first polysilicon layer is deposited to a thickness of between about 500 and 1500 Angstroms.

20. The method of claim 16, wherein said silicide layer is tungsten silicide and is deposited to a thickness of between about 800 and 1500 Angstroms.

21. The method of claim 16, wherein said second insulating layer is silicon oxide ($SiO_2$) and has a thickness is between bout 4000 and 8000 Angstroms.

22. The method of claim 16, wherein said second polysilicon layer is in-situ $N^+$ doped with phosphorus to a concentration of between about 1.0 E 19 and 1.0 E 21 atoms/cm$^3$, and said second polysilicon layer is deposited to a thickness of between about 500 and 1500 Angstroms.

23. The method of claim 16, wherein said etch endpoint detect layer is a refractory metal silicide and has a thickness of between about 500 and 1000 Angstroms.

24. The method of claim 16, wherein said etch endpoint detect layer is an undoped polysilicon and has a thickness of between about 500 and 1000 Angstroms.

25. The method of claim 16, wherein said third polysilicon layer is in-situ $N^+$ doped with phosphorus to a concentration of between about 1.0 E 19 and 1.0 E 21 atoms/cm$^3$, and said second polysilicon layer has a thickness of between about 7000 and 9000 Angstroms.

26. The method of claim 16, wherein said third insulating layer is silicon oxide deposited by low pressure chemical vapor deposition using tetraethosiloxane (TEOS) to a thickness of between about 300 and 800 Angstroms.

27. The method of claim 16, wherein said third insulating layer is silicon oxynitride (SiON) deposited by plasma enhanced chemical vapor deposition to a thickness of between about 300 and 800 Angstroms.

28. The method of claim 16, wherein said fourth polysilicon layer is deposited using low pressure chemical vapor deposition in a pressure range of about 0.01 to 1.0 torr and at a temperature of between about 560 and 590° C. to form said hemispherical-shaped grains having grain sizes of between about 0.05 and 0.20 micrometers ($\mu$m).

29. The method of claim 16, wherein said anisotropic plasma etching of said third polysilicon layer is terminated at said etch endpoint detect layer using optical emission spectroscopy.

30. The method of claim 16, wherein said interelectrode dielectric layer is silicon oxide/silicon/nitride/silicon oxide (ONO) deposited to a thickness of between about 52 and 60 Angstroms.

31. The method of claim 16, wherein said fifth polysilicon layer is $N^+$ doped with phosphorus to a concentration of between about 1.0 E 19 and 1.0 E 21 atoms/cm$^3$, and said second polysilicon layer has a thickness of between about 1000 and 1500 Angstroms.

32. A method for fabricating an array of brush-shaped stacked capacitors on dynamic random access memory (DRAM) devices comprising the steps of:

forming field oxide areas on a semiconductor substrate while leaving device areas for fabrication of semiconductor devices;

forming said semiconductor device structures in and on said device areas of said semiconductor substrate;

depositing a first insulating layer over said device areas and said field oxide areas;

planarizing said first insulating layer;

forming first openings in said first insulating layer to said device areas where electrical contacts are desired for said array of stacked capacitors;

depositing a first polysilicon layer on said first insulating layer and filling said first openings;

depositing a silicide layer on said first polysilicon layer to form a polycide layer;

patterning by photoresist masking and selective anisotropic plasma etching said polycide layer to said first insulating layer to form bit lines while leaving portions of said first polysilicon layer in said first openings to provide node contacts to said device areas for said stacked capacitors, and to serve as landing pads;

depositing a second insulating layer over said bit lines and over said first polysilicon layer in said first openings;

planarizing said second insulating layer; forming second openings in said second insulating layer to said first polysilicon layer in said first openings;

depositing a second polysilicon layer and filling said second openings;

depositing an etch endpoint detect layer on said second polysilicon layer;

depositing a thick third polysilicon layer on said etch endpoint detect layer;

depositing a third insulating layer on said third polysilicon layer;

patterning said third insulating layer, said third polysilicon layer, said etch endpoint detect layer, and said second polysilicon layer to said second insulating layer thereby leaving portions over said second openings for bottom electrodes of said stacked capacitors;

forming a layer of hemispherical-shaped grains (HSGs) from a conformal fourth polysilicon layer sufficiently thin to leave openings between said hemispherical-shaped grains, and further said hemispherical-shaped grains formed on the sidewalls of said bottom electrodes;

plasma etching said third insulating layer between said hemispherical-shaped grains to said third polysilicon layer on top surface of said bottom electrodes while retaining said hemispherical-shaped grains on said sidewalls;

anisotropic plasma etching said third polysilicon layer to said etch endpoint detect layer using said third insulating layer as a hard mask, and further removing said hemispherical-shaped grains between said bottom electrodes and forming an array of said bottom electrodes for said array of brush-shaped stacked capacitors, wherein said anisotropic plasma etching is terminated at said etch endpoint detect layer using optical emission spectroscopy;

forming an interelectrode dielectric layer on said bottom electrodes;

depositing and patterning a fifth polysilicon layer to form top electrodes thereby completing said array of brush-shaped stacked capacitors for said DRAM devices.

* * * * *